United States Patent
Howell

(10) Patent No.: US 6,247,632 B1
(45) Date of Patent: Jun. 19, 2001

(54) MOLDED SELECTIVE SOLDER PALLET

(75) Inventor: David A. Howell, Boise, ID (US)

(73) Assignee: MCMS Inc., Nampa, ID (US)

( * ) Notice: Subject to any disclaimer, the term of this patent is extended or adjusted under 35 U.S.C. 154(b) by 0 days.

(21) Appl. No.: 09/707,621

(22) Filed: Nov. 6, 2000

Related U.S. Application Data

(62) Division of application No. 09/173,493, filed on Oct. 15, 1998, now Pat. No. 6,142,357.

(51) Int. Cl.$^7$ .............................. B23K 1/08; B23K 37/06; B05C 3/10
(52) U.S. Cl. .................... 228/101; 228/212; 228/47.1; 264/299; 264/319
(58) Field of Search .............................. 228/245, 39, 214, 228/21, 101, 47.1, 212; 438/26, 51, 55, 64, 106; 427/96; 29/827; 118/406; 264/299, 319, 337

(56) References Cited

U.S. PATENT DOCUMENTS

| | | | |
|---|---|---|---|
| 4,387,139 | * 6/1983 | Herwig et al. | 428/423.7 |
| 4,636,406 | * 1/1987 | Leicht | 427/96 |
| 5,759,737 | * 6/1998 | Feilchenfeld et al. | 430/311 |
| 5,819,394 | * 10/1998 | Curtin | 29/527.2 |
| 5,820,983 | * 10/1998 | Curtin | 425/388 |
| 5,878,661 | * 3/1999 | Glovatsky et al. | 101/127 |
| 6,080,650 | * 6/2000 | Edwards | 438/612 |
| 6,093,249 | * 7/2000 | Curtin | 118/500 |

* cited by examiner

Primary Examiner—Clifford C. Shaw
Assistant Examiner—Colleen Cooke
(74) Attorney, Agent, or Firm—Craig M. Korfanta

(57) ABSTRACT

A molded selective solder pallet and a method for fabricating a molded selective solder pallet for use in a wave soldering process to selectively affix solder to an area of a circuit board having an electronic component thereon. The selective solder pallet according to the present invention includes a mold base configured having an aperture formed through its cross-section. A high temperature casting material is molded within the mold base and configured to have at least one recess and at least one solder flow opening. A high temperature silicone casting material may be employed as the high temperature casting material.

2 Claims, 4 Drawing Sheets

MOLDED SELECTIVE SOLDER PALLET

This application is a Division of Ser. No. 09/173,493, Oct. 15, 1998, now U.S. Pat. No. 6,142,357.

TECHNICAL FIELD

This invention generally relates to methods and devices for applying solder to workpieces and more particularly to a method and an apparatus which uses a molded selective solder pallet to allow selective application of solder to a circuit board with a wave soldering device.

BACKGROUND

Many electronic devices use a circuit board as the foundation building block for the electronic circuitry which forms the device. With the advent of the printed circuit board (PCB), the board itself actually became part of the circuit, forming conductors for the electrical current between the various electronic components. The circuit board both supports the electronic components and links them together. Generally, the circuit board consists of a nonconductive base, such as fiberglass, coated with a thin layer of a conductor, such as copper, which is etched to form a pattern of electrical conductors.

Soldering of the various electronic components to a circuit board is generally accomplished by one or more of the following processes: manual soldering, reflow soldering, discreet component soldering using a solder pot and flow well or continuous soldering using a wave soldering machine.

Wave soldering has long been the soldering method of choice for high production circuit boards which require through-hole parts. This is a continuous process in which circuit boards are passed over a wave of molten solder. The solder wets up through metal plated holes containing the component leads to consummate the soldering process. While this process lends itself to automation, as the parts are simply loaded onto a conveyor which in turn passes the parts over a wide wave of solder, it also imposes restrictions in terms of which parts can be exposed to the high thermal shock of a molten solder wave. For instance, it is oftentimes desirable to mix surface mount components and through-hole components on the same board. However, it usually isn't desirable to expose a surface mount IC components directly to a solder wave as thermal damage to the component may result. Additionally, the connections of surface mount components are so close together that solder can easily bridge two or independent more connections. Consequently, areas on the side of the board which cannot be exposed to a wave, and which otherwise would be wave soldered, are soldered by some other method.

Further advances in PCB technology have resulted in dual sided PCBs, to which components are attached on both sides of the boards, allowing intricate and complex circuits to be implemented in a smaller footprint. These doublesided and mixed technology assemblies may employ active components including integrated circuits (IC's) and memory devices packed tightly on both sides of the PCB. In such cases, industry practices specify that either a custom design flow well on the solder pot be used or a wave solder machine equipped with a special baffle to expose only those areas requiring solder. The latter has proven to be a slow process which only may be accomplished after in-depth training.

U.S. Pat. No. 5,148,961 to Humbert et al. discloses a hybrid soldering technique which includes a narrow solder wave from a solder pot and selectively applies this wave to a circuit board through a pallet containing a solder mask for the narrow portion of the board which is exposed to the solder pot wave. The pallet mask includes through-holes which correspond to the areas of the board on which solder is to be deposited, and recesses in the mask to house and protect components which would otherwise be exposed to the solder. The pallet is also provided with an inverted "V" shaped channel on the pallet's underside to prevent solder from splashing onto other parts of the circuit board. Unfortunately, this solution still requires a separate soldering device apart from a wave soldering machine. Also, this solution is not suited for or capable of simultaneously and selectively soldering two or more areas of a circuit board which are not located in the same narrow area of the board, since the entire board cannot be simultaneously passed through the wave.

Another solution is posed in U.S. Pat. No. 5,617,990 to Curtis C. Thompson, Sr. The patent to Thompson discloses a shield for use in wave soldering processes to selectively affix solder to an area of circuit board, having one or more electronic components on the solder side of the board. The shield includes a generally planar base member of a low thermal conductivity. One or more solder flow openings are formed through the base member extending from upper side to lower side. Solder flow openings are positioned to align with the selected areas of circuit board to which solder is to be affixed. One or more recesses are provided in the upper surface of the base member to receive and shield the electronic components on the solder side of the board.

The patent to Thompson also discloses a base plate or pallet made from a heat and solder resistant material sold under the tradename Delmat. The material is a composite material which is machinable and is capable of maintaining its mechanical properties at soldering temperatures. The material has a low thermal conductivity and may be specified in an electrostatic dissipative version which is suitable for electrostatic discharge sensitive applications.

Pallets formed of this material, while extremely durable, is relatively expensive due both to the cost associated with the material and the costs associated with machining the material to form the pallet. Therefore, pallets formed of this material tend to be suitable for production runs involving a relatively high number of units. In those instances involving relatively low numbers of assembled units, pallets formed in this manner and using this material may not be economically feasible.

What is needed is selective solder pallet formed of a relatively inexpensive material which allows a work piece, such as a circuit board, to be soldered using a standard or conventional wave soldering machine.

Objects of the invention therefore include the provision of a reusable pallet for protecting selected areas of a work piece from molten solder and heat as the shield and work piece are passed through a solder wave, the pallet being formed of a relatively inexpensive material. An additional object of this invention is to provide a reusable pallet formed of a material which permits the use of relatively low-cost forming methods. Still another object of the invention is to provide a solution which can be used with existing wave soldering devices to selectively apply solder to a work piece.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A molded selective solder pallet according to the present invention may be fabricated employing a relatively rigid frame into which a high temperature casting compound is pressed. The molded selective solder pallet may be cast from the actual printed circuit assembly for which the molded selective solder pallet is being fabricated or, in the alternative, the molded selective solder pallet may be made using modeling clay, wax or similar material built up to replicate the recessed areas and the exposed solder areas of the printed circuit assembly.

The molded selective solder pallet includes a mold base formed of a heat and solder resistant material that is preferably machinable and capable of maintaining its mechanical properties at soldering temperatures. In addition, the material should exhibit a low thermal conductivity. One such material is Delmat, manufactured by Von Roll Isola, Inc. of Rutland, Vt. The mold base may be configured to provide hold down hardware for attaching the printed circuit assembly to the molded selective solder pallet. The mold base is formed having an aperture through its cross-section, the aperture sized to accommodate the placement of a printed circuit board within the aperture.

In the preferred embodiment of the invention, the mold base is nominally sized. By nominally sized it is meant that the outer peripheral dimensions of the mold base are such that the mold base may be utilized in the wave solder device without adaptation for a particular device. Similarly, the aperture is sized and configured to accept standard sized printed circuit boards.

One embodiment of the invention includes a registration mechanism formed on the inner surfaces of the mold base for holding the circuit board within the mold base in a fixed position relative to the mold base. The registration mechanism may include one or more marginally disposed ridges extending from the mold base inner face and configured to frictionally engage the peripheral edges of the circuit board when the circuit board is placed within the mold base aperture.

A high temperature casting material which is capable of exceeding 250° C. (480° F.) process temperatures for longer than 15 seconds is pressed into the frame providing the required configuration of recesses and solder flow openings. In one embodiment of the invention, a high temperature silicone casting material is pressed into the frame providing the required configuration of recesses and solder flow openings. One such material is identified as P-60 Silicone Rubber sold by the Moleon Company. This material exhibits cure times of 18–24 hours at room temperatures. This material cures having a Shore A hardness of approximately 62±3 and tensile strengths in the range of 700–1000 psi. Curing times may be accelerated using elevated temperatures. It has been observed that this material, when cured, is capable of withstanding the temperatures observed in the wave soldering process.

The molded selective solder pallet may also include a structural member attached to the mold base. The structural member may be fabricated from a metal, typically titanium or Delmat. The structural member provides rigidity to the assembly. The structural member may be configured as a frame. Additionally, stiffening members may be added to the molding compound to provide structural strength and reduce sagging during the wave solder operation. In one embodiment of the invention, the stiffening members are formed of Plexiglas or glass rods.

The molded selective solder pallet may be formed by first arranging a dam or dams around the area or areas of the printed circuit assembly which are to be exposed to solder during the soldering process. Dams may be formed of any material, including clay tiles, which may be readily released from the high temperature casting material following molding. Next, the high temperature casting material is pressed within the mold base over either the actual printed circuit assembly for which the molded selective solder pallet is being fabricated or, in the alternative, the molded modeling clay may be built up to replicate the recessed areas and the exposed solder areas of the printed circuit assembly, providing the required configuration of recesses and solder flow openings. Once the high temperature casting material cures, the dams are removed and the molded selective solder pallet is ready for use.

Additional objects, advantages and novel features of the invention will be set forth in part in the description that follows, and in part will become apparent to those skilled in the art upon examination of the following, or may be learned by practice of the invention. The objects and advantages of the invention may be realized and attained by means of the instrumentalities and combinations particularly pointed out in the appended claims.

DETAILED DESCRIPTION OF THE INVENTION

Referring now to the Figures, the molded selective solder pallet and a method for fabricating a molded selective solder pallet for use in a wave soldering process to selectively affix solder to an area of a circuit board having an electronic component will be more fully described.

Figure 1:
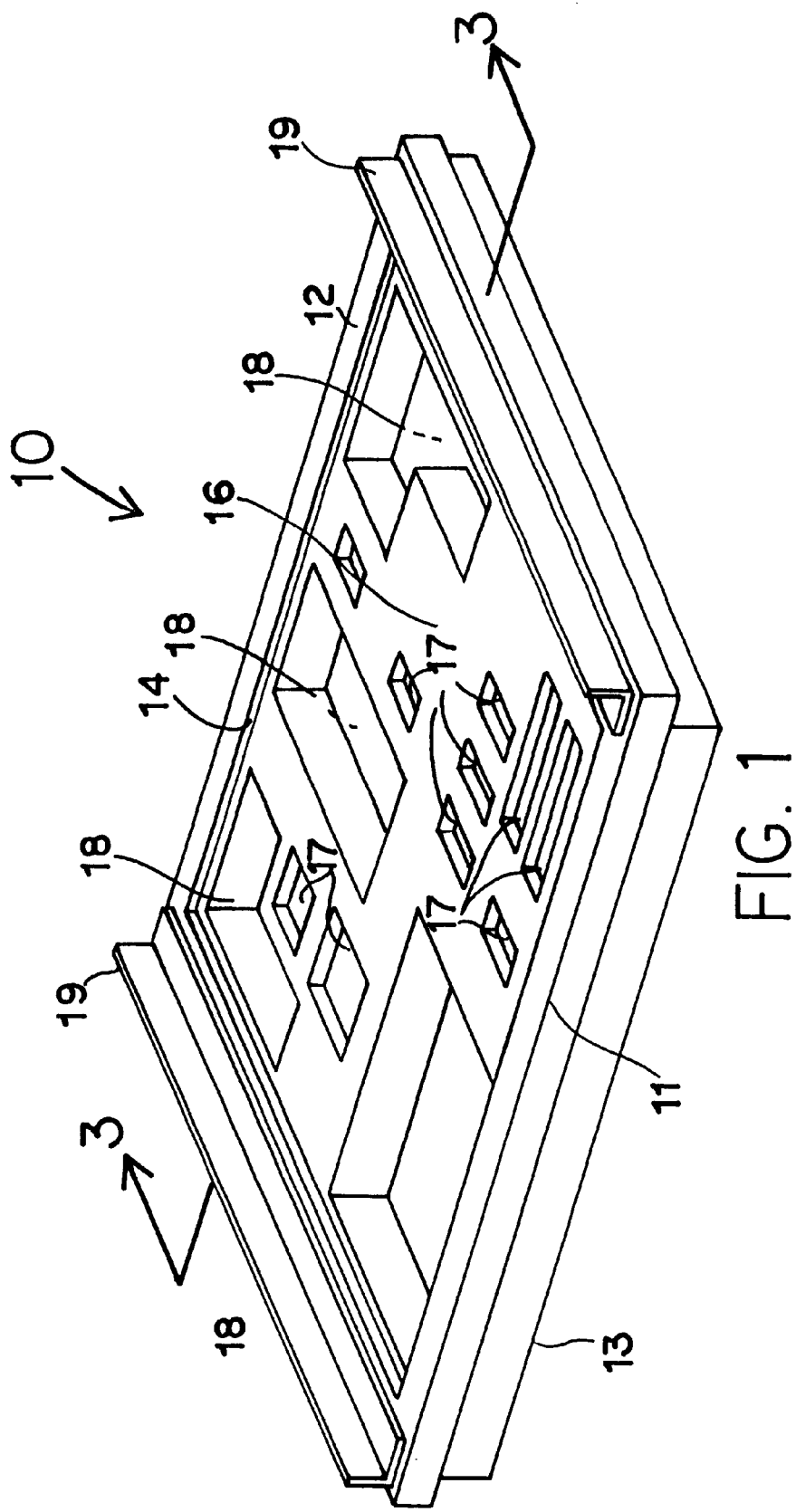
FIG. 1 is a perspective representational view of a molded selective solder pallet according to the invention.

Referring to FIG. 1, printed molded selective solder pallet 10 is shown to advantage. Molded selective solder pallet 10 includes mold base 11 having upper face 12 and lower face 13. Molded selective solder pallet 10 is formed having aperture 14 through its cross section. Aperture 14 is sized to permit the placement of a printed circuit assembly board P within its margins.

Also as shown in FIG. 1, molded selective solder pallet 10 includes casting materials 16 pressed within the margins of aperture 14. Formed within the casting material 16 are recesses 17 and solder flow openings 18.

Also as shown in FIG. 1, molded selective solder pallet 10 may include a structural member 19 attached in this case to the upper face of mold base 11.

Figure 2:
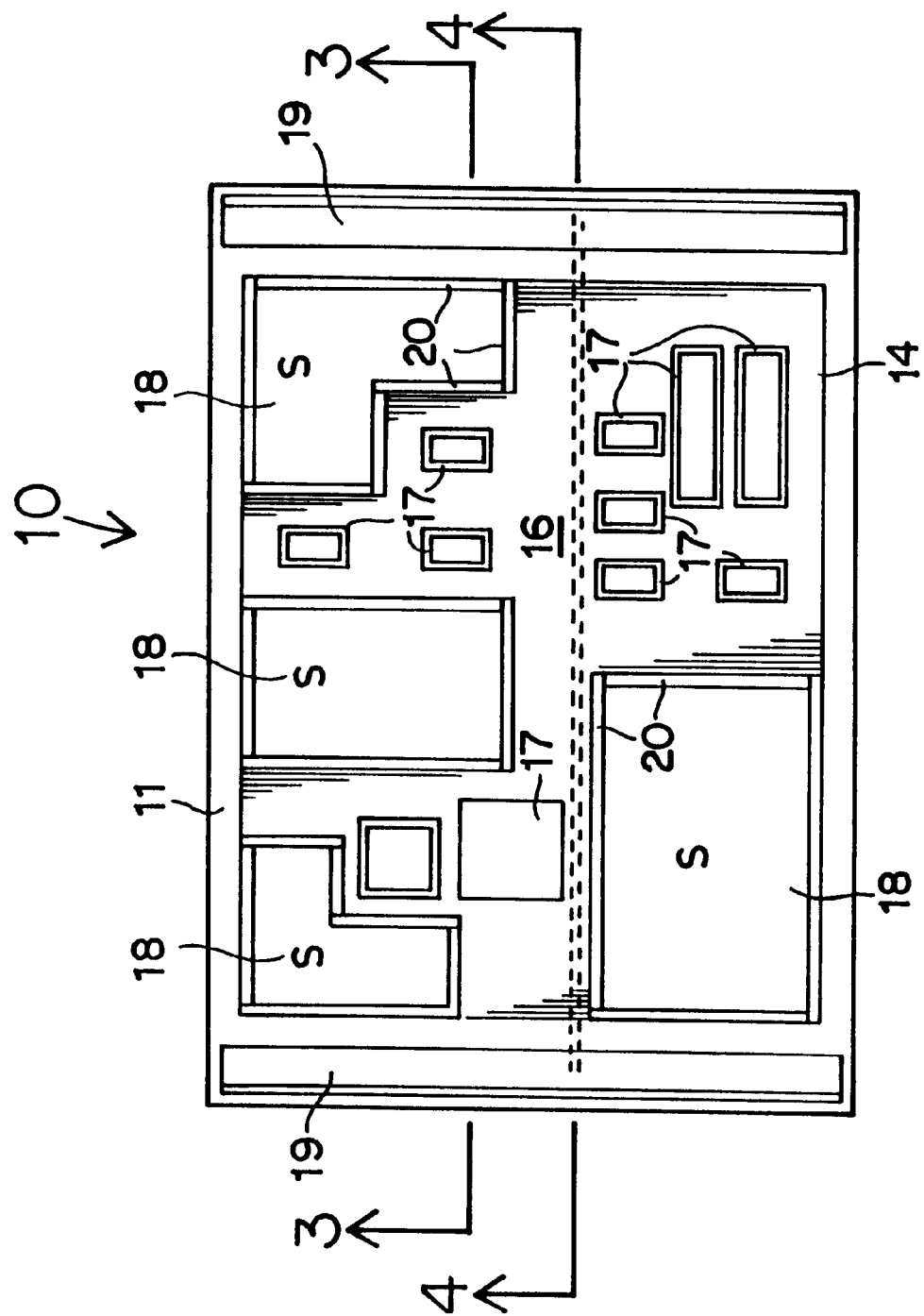
FIG. 2 is a top representational view of a molded selective solder pallet according to the invention.

Referring to FIG. 2, molded selective solder pallet 10 is shown including mold base 11 having aperture 14 formed therein. Structural members 19 are attached to the upper face 12 of molded selective solder pallet 10 and provide rigidity to the assembly.

Casting material 16 is shown pressed within aperture 14 forming once again a plurality of recesses 17 and a plurality of solder flow openings 18.

Figure 3:
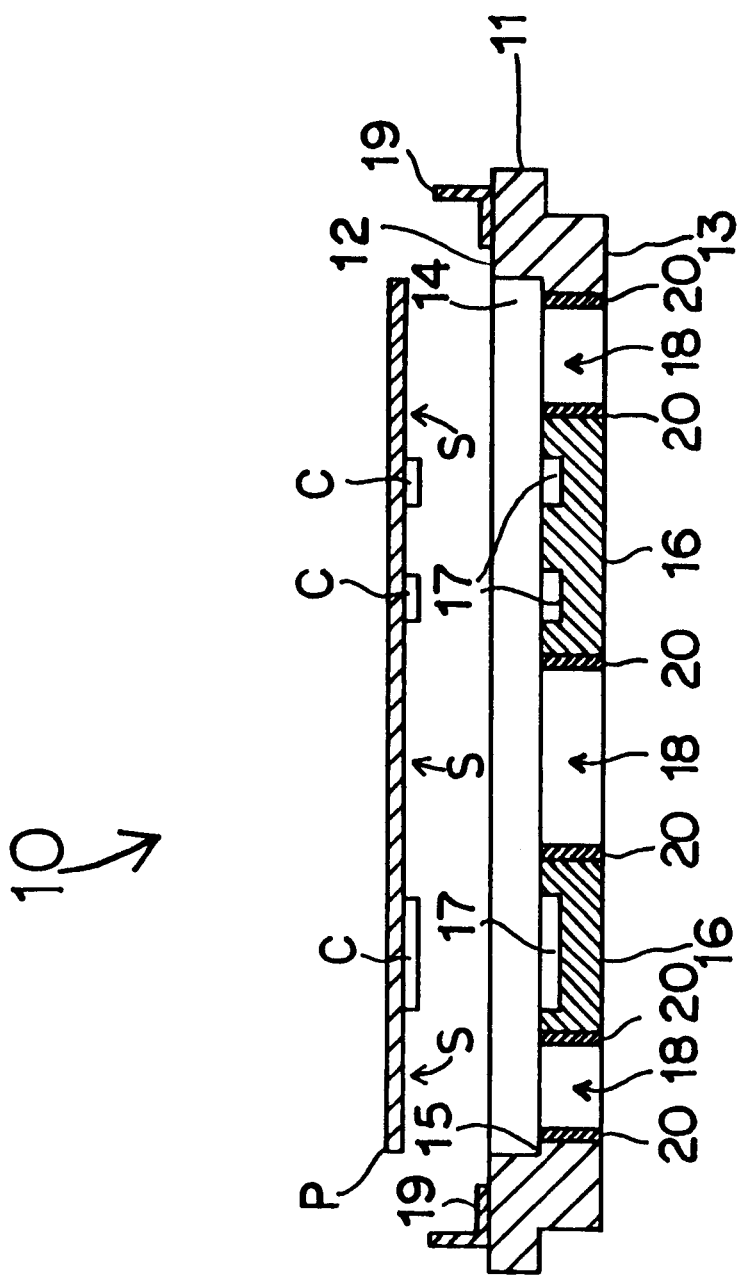
FIG. 3 is a cross section view of the molded selective solder pallet according to the invention.

FIG. 2 also shows dams 20, which are placed about solder flow openings 18 during the formation of molded selective solder pallet 10. Dams 20 are place about those areas where solder will flow during the solder process Referring to FIG. 3, molded selective solder pallet 10 is shown in cross section. Once again, molded selective solder pallet 10 includes mold base 11 having upper face 12 and lower face 13. Molded selective solder pallet 10 is configured having aperture 14 formed through its cross section. In the embodiment shown in FIG. 3, molded selective solder pallet 10 includes marginally disposed registration ridges 15 providing a registration mechanism formed on mold base 11 for holding a printed circuit board assembly P against mold base 11 in a fixed position relative to mold base 11. A marginal printed circuit board assembly P is shown above mold base 11 positioned for placement within molded selective solder pallet 10. As shown in FIG. 3, the size and placement of electronic component C correspond with the size and placement of recesses 17 formed in molded selective solder pallet 10. Also shown in FIG. 3, dams 20 are positioned for placement of casting material 16 within aperture 14 to prohibit casting material 16 from entry in those areas of molded selective solder pallet 10 where solder flow openings 18 are to be formed.

Figure 4:
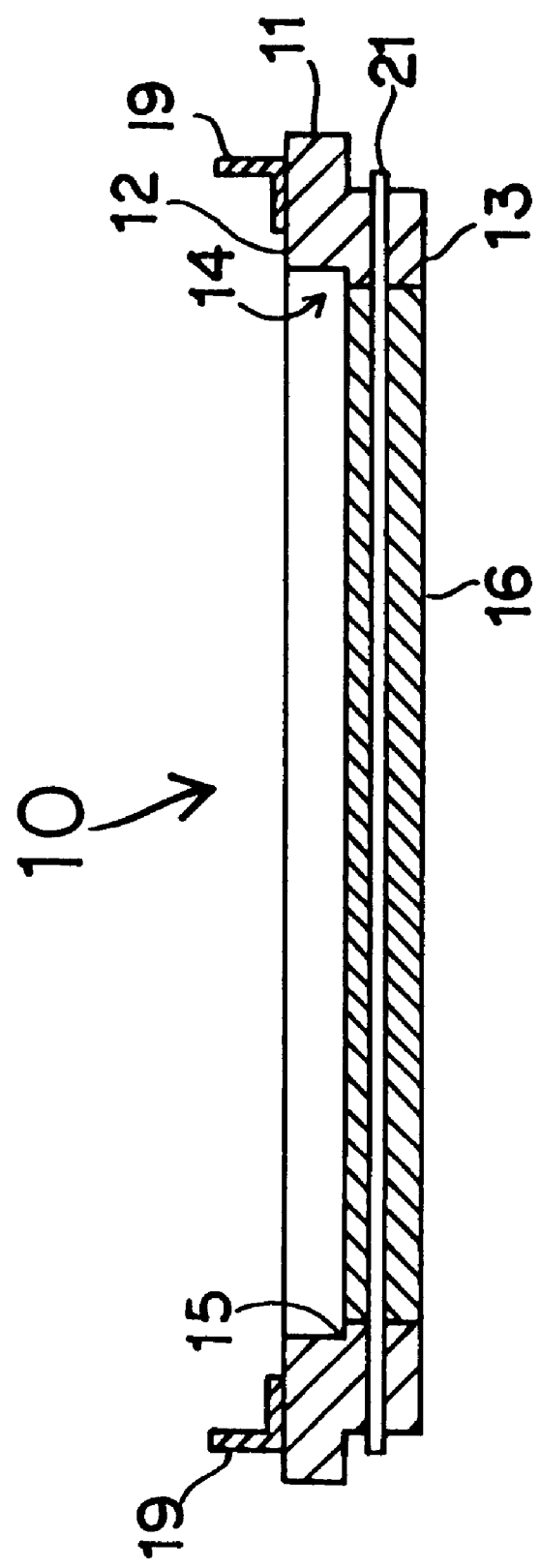
FIG. 4 is a cross section view of the molded selective solder pallet according to the invention.

Referring to FIG. 4, molded selective solder pallet 10 is shown in cross section. Once again, molded selective solder pallet 10 includes mold base 11 having upper face 12 and lower face 13. Molded selective solder pallet 10 is configured having aperture 14 formed through its cross section. In the embodiment shown in FIG. 4, molded selective solder pallet 10 includes marginally disposed registration ridges 15 formed on mold base 11 for holding a printed circuit board assembly P against mold base 11 in a fixed position relative to mold base 11. FIG. 4, shows casting material 16 placed within aperture 14. Stiffening member 21 is shown embedded within casting material 16.

I claim:

1. A method for forming a molded selective solder pallet including the steps of:

arranging a dam around an area of a printed circuit assembly which is to be exposed to solder during a soldering process;

placing the printed circuit assembly within an aperture formed through the cross-section of a mold base;

pressing a high temperature casting material within the mold base over the printed circuit assembly and around the dam forming at least one recess and at least one solder flow opening; and curing the high temperature casting material.

2. A method for forming a molded selective solder pallet including the steps of:

forming a model printed circuit assembly to replicate the recessed areas and the exposed solder areas of the printed circuit assembly;

arranging a dam around an area of a model printed circuit assembly which is to be exposed to solder during a soldering process;

placing the model printed circuit assembly within an aperture formed through the cross-section of a mold base;

pressing a high temperature casting material within the mold base over the model printed circuit assembly and around the dam forming at least one recess and at least one solder flow opening; and curing the high temperature casting material.

* * * * *